(12) United States Patent
Ryu et al.

(10) Patent No.: US 12,181,013 B2
(45) Date of Patent: Dec. 31, 2024

(54) SHOCK ABSORBING MODULE AND DISPLAY DEVICE INCLUDING THE SAME

(71) Applicants: Samsung Display Co., LTD., Yongin-si (KR); ILJIN Materials Co., Ltd., Iksan-si (KR)

(72) Inventors: Jong Ho Ryu, Seoul (KR); Jong Il Park, Anyang-si (KR); Namhee Park, Yongin-si (KR); Jungmin Park, Hwaseong-si (KR); Jonghyun Sung, Seoul (KR); Yeongseok Song, Seoul (KR); Min-Woo Choi, Hwaseong-si (KR)

(73) Assignees: SAMSUNG DISPLAY CO., LTD., Gyeonggi-Do (KR); LOTTE ENERGY MATERIALS CORPORATION, Jeollabuk-Do (KR)

( * ) Notice: Subject to any disclaimer, the term of this patent is extended or adjusted under 35 U.S.C. 154(b) by 371 days.

(21) Appl. No.: 16/827,896

(22) Filed: Mar. 24, 2020

(65) Prior Publication Data
US 2020/0325952 A1 Oct. 15, 2020

(30) Foreign Application Priority Data
Apr. 12, 2019 (KR) ........................ 10-2019-0043142

(51) Int. Cl.
| | | |
|---|---|---|
| *H01L 51/56* | (2006.01) | |
| *B32B 7/12* | (2006.01) | |
| *B32B 9/00* | (2006.01) | |
| *B32B 15/20* | (2006.01) | |
| *B32B 27/06* | (2006.01) | |

(Continued)

(52) U.S. Cl.
CPC .............. *F16F 1/3737* (2013.01); *B32B 7/12* (2013.01); *B32B 9/007* (2013.01); *B32B 15/20* (2013.01); *B32B 27/06* (2013.01); *B32B 27/36* (2013.01); *H10K 50/844* (2023.02); *H10K 50/86* (2023.02); *H10K 59/40* (2023.02); *H10K 71/00* (2023.02); *B32B 2457/20* (2013.01);
(Continued)

(58) Field of Classification Search
None
See application file for complete search history.

(56) References Cited

U.S. PATENT DOCUMENTS

| | | |
|---|---|---|
| 9,618,781 B2 | 4/2017 | Jang et al. |
| 9,709,843 B2 | 7/2017 | Kamiyama et al. |

(Continued)

FOREIGN PATENT DOCUMENTS

| | | |
|---|---|---|
| CN | 1760564 A | 4/2006 |
| CN | 102046748 A | 5/2011 |

(Continued)

*Primary Examiner* — Anthony J Frost
(74) *Attorney, Agent, or Firm* — CANTOR COLBURN LLP

(57) ABSTRACT

A shock absorbing module includes a shock absorbing layer at which the shock absorbing module is attachable to a display panel, the shock absorbing layer including a cushion layer including an adhesive polymer resin, and a hollow particle which is in the adhesive polymer resin, and an embossed adhesive layer with which the shock absorbing layer is attachable to the display panel, and a base layer. The shock absorbing module attached to the display panel disposes the shock absorbing layer between the display panel and the base layer.

20 Claims, 11 Drawing Sheets

(51) Int. Cl.
*B32B 27/36* (2006.01)
*F16F 1/373* (2006.01)
*H10K 50/844* (2023.01)
*H10K 50/86* (2023.01)
*H10K 59/40* (2023.01)
*H10K 71/00* (2023.01)

(52) U.S. Cl.
CPC ... *F16F 2224/02* (2013.01); *F16F 2224/0208* (2013.01); *F16F 2230/40* (2013.01)

(56) References Cited

U.S. PATENT DOCUMENTS

| | | |
|---|---|---|
| 10,229,961 B2 | 3/2019 | Choi et al. |
| 2006/0110608 A1 | 5/2006 | Azumi et al. |
| 2011/0064916 A1* | 3/2011 | Sherman .............. B32B 27/06 156/60 |
| 2015/0314561 A1* | 11/2015 | Kim ..................... B32B 7/05 156/60 |
| 2016/0160096 A1* | 6/2016 | Hirose .................. C09J 133/14 526/309 |
| 2016/0170517 A1* | 6/2016 | Donnelly .............. G06F 3/0445 345/174 |
| 2017/0266917 A1* | 9/2017 | Wilson .................. G06F 1/182 |
| 2017/0309843 A1* | 10/2017 | Kim ........................ B32B 3/266 |
| 2017/0330917 A1 | 11/2017 | Kim et al. |
| 2017/0362469 A1 | 12/2017 | Sherman et al. |
| 2018/0103553 A1* | 4/2018 | Kim ......................... G02B 5/20 |

FOREIGN PATENT DOCUMENTS

| | | |
|---|---|---|
| CN | 105378018 A | 3/2016 |
| CN | 107003777 A | 8/2017 |
| CN | 107109145 A | 8/2017 |
| CN | 107305906 A | 10/2017 |
| CN | 109587981 A | 4/2019 |
| JP | 5815054 B2 | 11/2015 |
| KR | 1020180008965 A | 1/2018 |
| KR | 1020180045929 A | 5/2018 |
| KR | 1020180062922 A | 6/2018 |
| KR | 10-1909436 B1 | 10/2018 |

\* cited by examiner

SHOCK ABSORBING MODULE AND DISPLAY DEVICE INCLUDING THE SAME

This application claims priority to Korean Patent Application No. 10-2019-0043142, filed on Apr. 12, 2019, and all the benefits accruing therefrom under 35 U.S.C. § 119, the entire contents of which are hereby incorporated by reference.

BACKGROUND

(1) Field

The present disclosure relates to a shock absorbing module and a display device including the same.

(2) Description of the Related Art

Various display devices are being developed for use in multimedia devices such as televisions, mobile phones, tablet computers, navigation systems, gaming machines, and the like.

A display device including a shock absorbing module has been developed in order to absorb a shock to the display device, which may occur when the display device is dropped during use.

SUMMARY

Where a shock absorbing module of a display device includes a plurality of layers, reducing an overall thickness of the display device may be difficult and separation at an interface between the layers may occur.

One or more embodiment of the invention provides a shock absorbing module with a relatively slim structure and high durability, and a display device including the same.

According to an embodiment of the invention, a shock absorbing module includes a shock absorbing layer at which the shock absorbing module is attachable to a display panel, the shock absorbing layer including a cushion layer including an adhesive polymer resin, and a hollow particle which is in the adhesive polymer resin, and an embossed adhesive layer with which the shock absorbing layer is attachable to the display panel, and a base layer. The shock absorbing module attached to the display panel disposes the shock absorbing layer between the display panel and the base layer.

In an embodiment, the shock absorbing module may further include a light-blocking layer. The shock absorbing module attached to the display panel may dispose the embossed adhesive layer between the display panel and the light-blocking layer.

In an embodiment, the adhesive polymer resin may include at least one of acrylic polymer, urethane polymer, olefin polymer, imide polymer, amide polymers ester polymer, isocyanate polymer, epoxy polymer, and silicone polymer.

In an embodiment, the shell of the hollow particle may include polymerized acrylic monomer or polymerized vinyl chloride monomer. A density of the hollow particle may range from about 0.08 gram per cubic centimeter (g/cm$^3$) to about 0.40 g/cm$^3$.

In an embodiment, a weight percentage of the hollow particle to a total weight of the cushion layer may range from about 0.5 wt % to about 20.0 wt %.

In an embodiment, the hollow particle may include a mean diameter from about 10 micrometers (μm) to about 40 μm or a mean diameter from about 40 μm to about 80 μm.

In an embodiment, the embossed adhesive layer may include a base portion and a pattern which protrudes from the base portion and with which the embossed adhesive layer is attachable to the display panel.

The cushion layer may further include a light blocking material. The light blocking material may be a carbon black nanoparticle. A weight percentage of the carbon black nanoparticle to a total weight of the cushion layer may range from about 0.5 weight percent (wt %) to about 5.0 wt %.

The shock absorbing layer may further include a first film layer including polyimide. The shock absorbing module attached to the display panel may dispose the embossed adhesive layer between the display panel and the film layer.

The base layer may include a film layer, a metal layer, and a graphite layer, which are sequentially stacked in a direction toward the shock absorbing layer. The film layer may include polyethyleneterephthalate. The metal layer may include copper.

According to an embodiment of the invention, a shock absorbing layer includes a cushion layer including an adhesive polymer resin; a hollow particle in the adhesive polymer resin, the hollow particle including a polymerized acrylic monomer or a polymerized vinyl chloride monomer; and a carbon black nanoparticle in the adhesive polymer resin; and an embossed adhesive layer directly on the cushion layer and at which the shock absorbing layer is attachable to a display panel.

In an embodiment, a weight percentage of the carbon black nanoparticle to a total weight of the cushion layer may range from about 0.5 wt % to about 5.0 wt %, and a weight percentage of the hollow particle to a total weight of the adhesive polymer resin and the hollow particle may range from about 0.5 wt % to about 20 wt %.

The embossed adhesive layer may be defined by a plurality of protrusions spaced apart from each other, and an extended portion of the cushion layer may define the plurality of protrusions.

The hollow particle may have a mean diameter ranging from about 10 μm to about 80 μm.

According to an embodiment of the invention, a display device may include a display panel and a shock absorbing layer which is attachable to the display panel. The shock absorbing layer includes: a cushion layer including an acrylic resin and a hollow particle which is in the acrylic resin; a light-blocking layer directly on the cushion layer; and an embossed adhesive layer with which the shock absorbing layer is attachable to the display panel. The hollow particle within the cushion layer includes a polymerized acrylic monomer or a polymerized vinyl chloride monomer, and the hollow particle has a mean diameter from about 10 μm to about 80 μm.

The display panel may include a light-emitting device, a thin encapsulation layer, and an input sensing sensor directly on the thin encapsulation layer. The thin encapsulation layer may be disposed on the light-emitting device. The input sensing sensor may be directly on the thin encapsulation layer.

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1:
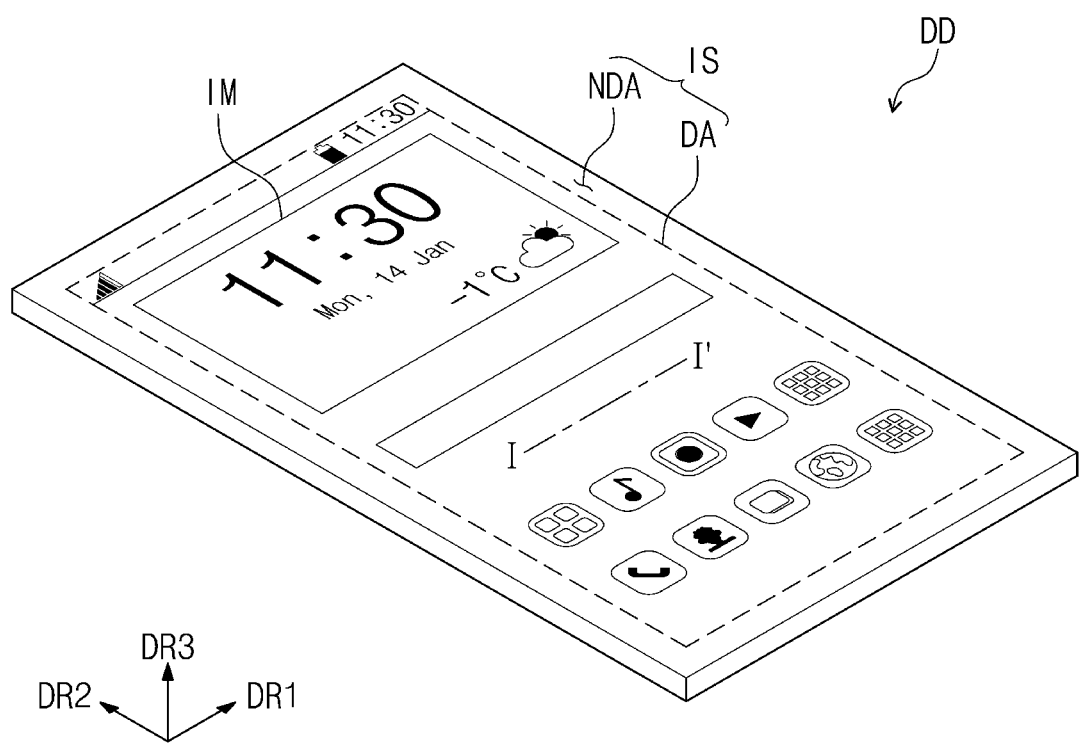
FIG. 1 is a perspective view illustrating an embodiment of a display device.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the invention will now be described more fully with reference to the accompanying drawings, in which embodiments are shown. Example embodiments of the invention may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout.

It will be understood that when an element is referred to as being related to another element such as being "on," "between," "adjacent" and the like, the element may be directly on the other element or intervening elements may be present therebetween. In contrast, when an element is referred to as being related to another element such as being "directly on," "directly between," "directly adjacent" and the like, there are no intervening elements present therebetween.

It will be understood that, although the terms "first," "second" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. As used herein the term "and/or" includes any and all combinations of one or more of the associated listed items. "At least one" is not to be construed as limiting "a" or "an." "Or" means "and/or." It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the invention are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which example embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating an embodiment of a display device DD. As shown in FIG. 1, the display device DD may include a display surface IS at which an image IM is displayed. The display surface IS may be defined in a plane which is parallel to a plane defined by a first direction DR1 and a second direction DR2 which cross each other. A normal direction of the display surface IS (e.g., a thickness direction of the display device DD) will be referred to as a third direction DR3.

In the following description, the third direction DR3 may be used to differentiate a front or top surface of each element from a back or bottom surface thereof. However, directions indicated by the first to third directions DR1, DR2, and DR3 may be just an example or a relative concept and may not be limited to the above example, and, in certain embodiments, they may be changed to indicate other directions. Hereinafter, first to third directions may be directions indicated by the first to third directions DR1, DR2, and DR3, respectively, and will be identified with the same reference numbers.

In FIG. 1, the display device DD is illustrated to have a display surface IS which is flat, but the invention is not limited thereto. The display surface IS of the display device DD may have a curved or three-dimensional shape. In the case where the display surface IS of the display device DD has the three-dimensional shape, the display surface IS may include a plurality of display regions or display areas that are oriented in different directions. In an embodiment, for example, the display device DD may have a display surface IS that is shaped like a polygonal pillar.

The display device DD according to one or more embodiment may be a display device DD which is flexible. However, the invention is not limited to this example, and in an embodiment, the display device DD may be a display device DD which is relatively rigid (e.g., flat or not bendable). The display device DD, which can be used for a portable electronic terminal, is exemplarily illustrated in FIG. 1. Although not shown, the portable electronic terminal may further include an electronic module, a camera module, a power module, and so forth, which are mounted on a mainboard and are provided in a housing member (not shown). The display device DD may be used for a relatively large-sized electronic devices (e.g., television sets and monitors) or relatively small- or medium-sized electronic devices (e.g., tablets, car navigation systems, game machines, and smart watches).

As shown in FIG. 1, the display surface IS may include a display region DA at which the image IM is generated and/or displayed, and a non-display region NDA which is adjacent to the display region DA. The non-display region NDA may not be used to display an image IM. As an example of the image IM, icon images are shown in FIG. 1. However, the invention is not limited to this example, and in an embodiment, the display surface IS may include only the display region DA.

As shown in FIG. 1, the display region DA may have a rectangular shape. The non-display region NDA may enclose the display region DA in a top plan view. However, the invention is not limited to this example, and the shapes of the display region DA and the non-display region NDA may be variously changed in a complementary manner.

Figure 2:
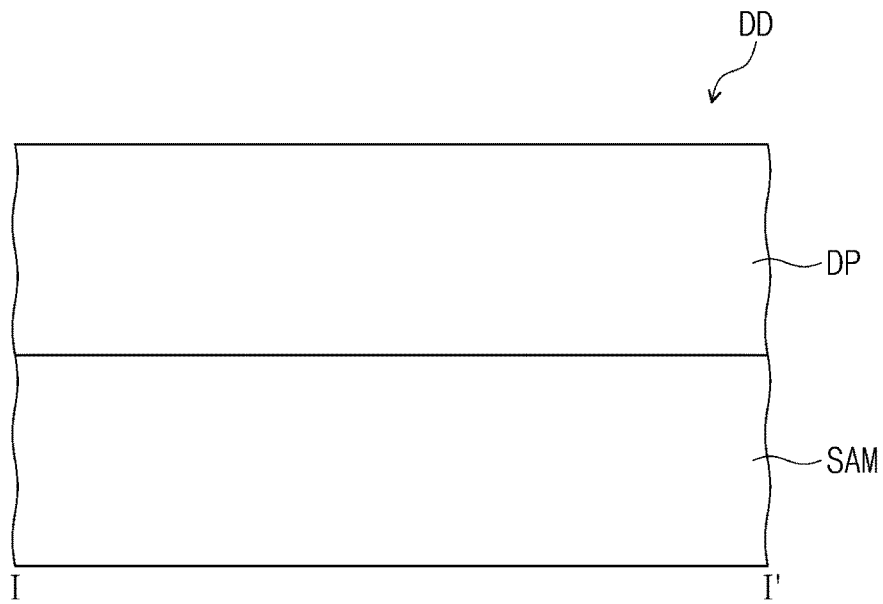
FIG. 2 is an enlarged cross-sectional view illustrating an embodiment of a portion of the display device, taken along line I-I' of FIG. 1.
Figure 2:
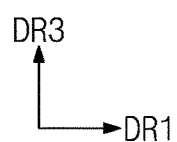
Figure 3:
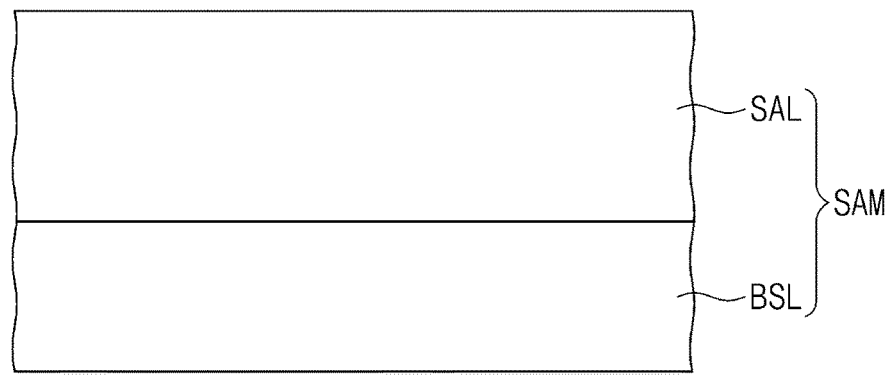
FIG. 3 is an enlarged cross-sectional view illustrating an embodiment of a shock absorbing module.
Figure 3:
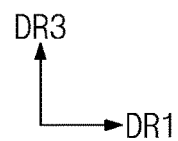

FIG. 2 is an enlarged cross-sectional view illustrating an embodiment of a portion of the display device DD, taken along line I-I' of FIG. 1. FIG. 3 is an enlarged cross-sectional view illustrating an embodiment of a shock absorbing module SAM. The shock absorbing module SAM shown in FIG. 3 may correspond to the shock absorbing module SAM shown in FIG. 2.

Referring to FIG. 2, the display device DD may include a display panel DP and the shock absorbing module SAM. The shock absorbing module SAM may be disposed below the display panel DP. As being below the display panel DP, the shock absorbing module SAM may be disposed along the third direction DR3 in a direction opposite to that in which the image IM is displayed.

Referring to FIG. 3, the shock absorbing module SAM may include a base layer BSL and the shock absorbing layer SAL. The base layer BSL may be disposed below the shock absorbing layer SAL. The base layer BSL may face the display panel with the shock absorbing layer SAL therebetween. Although not illustrated, an additional adhesive member may be disposed between the base layer BSL and the shock absorbing layer SAL.

Figure 4:
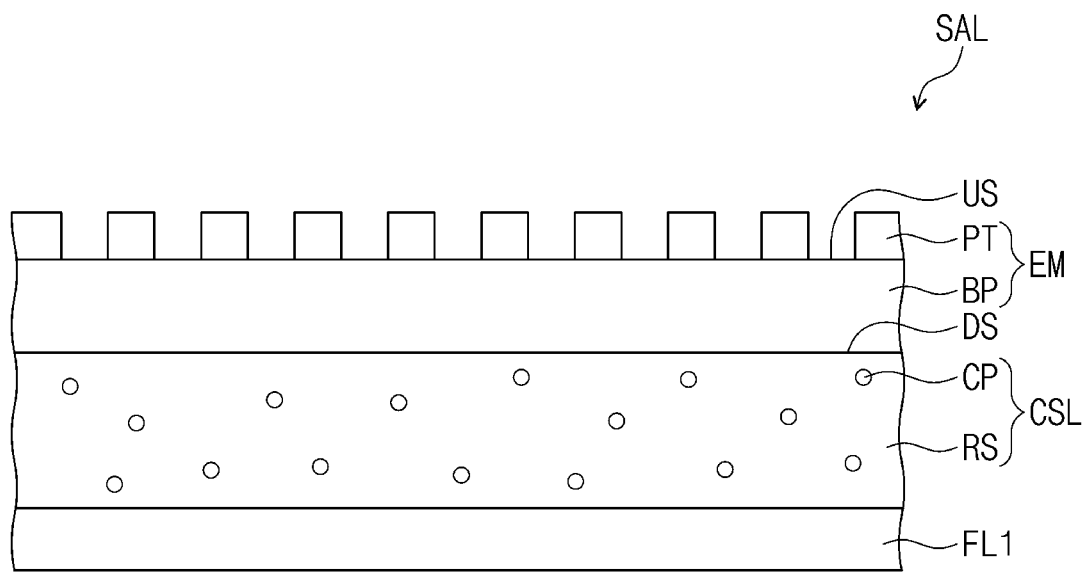
FIG. 4 is an enlarged cross-sectional view illustrating an embodiment of a shock absorbing layer of FIG. 3.
Figure 5:
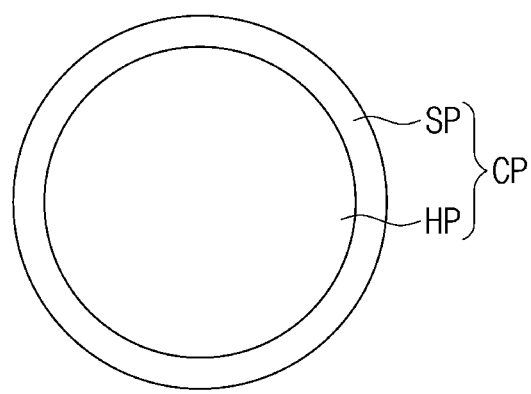
FIG. 5 is an enlarged cross-sectional view illustrating an embodiment of a hollow particle.

FIG. 4 is an enlarged cross-sectional view illustrating an embodiment of the shock absorbing layer SAL of FIG. 3. FIG. 5 is an enlarged cross-sectional view illustrating an embodiment of a hollow particle of the shock absorbing layer SAL.

Referring to FIG. 4, the shock absorbing layer SAL may include a cushion layer CSL, an embossed adhesive layer EM, and a first film layer FL1. In the present specification, a base film layer FL1 may mean the first film layer FL1.

The first film layer FL1 may include a synthetic resin film. The first film layer FL1 may include a thermo-setting resin. In an embodiment, the first film layer FL1 may be a polyimide resin layer, but the invention is not limited to a specific material of the first film layer FL1. The first film layer FL1 may be formed of or include at least one of acrylic resin, methacrylic resin, polyisoprene, vinyl resin, epoxy resin, urethane resin, cellulose resin, siloxane resin, polyamide resin, and perylene resin.

The cushion layer CSL may be disposed on the first film layer FL1. The cushion layer CSL may include a resin layer RS (e.g., an adhesive polymer resin RS) and a hollow particle CP. The adhesive polymer resin RS may be a homopolymer obtained by polymerizing any one selected from the monomer group of acrylic monomer, urethane monomer, olefin monomer, imide monomer, amide monomer, ester monomer, isocyanate monomer, epoxy monomer, and silicone monomer.

The adhesive polymer resin RS may be a copolymer of a first monomer and a second monomer. The first monomer and the second monomer may be of different types, and each monomer type may be a monomer selected from the afore-described monomer group.

However, the invention is not limited to this example, and the second monomer may be a monomer which is not included in the afore-described monomer group. In an embodiment, for example, the second monomer may be diamine monomer or diol monomer. The diamine monomer or the diol monomer may be used as a cross-linking agent.

The olefin monomer may be, for example, ethylene monomer, propylene monomer, or butylene monomer. The epoxy monomer may be, for example, bisphenol epoxy monomer.

In an embodiment, the adhesive polymer resin RS may be acrylic polymer obtained by polymerizing acrylic monomer (e.g., a polymerized acrylic monomer). In an embodiment, for example, the adhesive polymer resin RS may include at least one of polyacrylate (e.g., polymethylacrylate ("PMA") and polyethylacrylate ("PEA")), polymethylmethacrylate ("PMMA"), polyacrylonitrile ("PAN"), or polyacrylicamide ("PAA"). However, the invention is not limited to this example, and the adhesive polymer resin RS may include various types of acrylic polymer.

In a conventional display device where an additional adhesive layer is disposed on a top or bottom surface of the cushion layer CSL, the number of layers constituting the shock absorbing module SAM may be increased, which may lead to an increase of stress exerted on each layer. As a result, an adhesion failure and a layer-separation issue may occur at an edge portion of each of the layers constituting the shock absorbing layer SAL of the conventional display device.

According to one or more embodiment of the invention, since the cushion layer CSL includes the adhesive polymer resin RS (e.g., is self-adhesive), the cushion layer CSL may be adhered to other element, even when there is no additional adhesive layer on the top and bottom surfaces of the cushion layer CSL. Thus, the afore-described issues of the conventional display device may not occur. Accordingly, durability of the shock absorbing module SAM in one or more embodiment of the invention may be improved. In addition, since the additional adhesive layer is omitted in the display device DD, realizing a relatively small thickness of the shock absorbing module SAM is possible.

In the shock absorbing layer SAL according to an embodiment of the invention, since the additional adhesive layer is not disposed on or under the cushion layer CSL, the shock absorbing layer SAL may be fabricated through a relatively simple fabrication process, and reducing cost for the fabrication process may be possible.

The hollow particle CP may be dispersed in the adhesive polymer resin RS. The hollow particle CP may be provided in plural (e.g., plurality of hollow particles CP) uniformly or non-uniformly dispersed in the adhesive polymer resin RS to improve an elastic property of the cushion layer CSL. The hollow particle CP may be provided in plural to be uniformly dispersed in the adhesive polymer resin RS.

The hollow particle CP may include a void portion HP (e.g., empty portion HP) and a shell SP which surrounds the void portion HP. The shell SP of the hollow particle CP may include an organic polymer material. In an embodiment, for example, the shell SP of the hollow particle CP may be formed of or include a polymer material, which is obtained by polymerizing at least one of acrylic monomer and vinyl chloride monomer (e.g., a polymerized acrylic monomer or polymerized vinyl chloride monomer). In an embodiment, the hollow particle CP may be formed of or include a copolymer which is obtained by copolymerizing acrylonitrile monomer and acrylic monomer (e.g., copolymerized polymer of acrylonitrile monomer and acrylic monomer), or a copolymer which is obtained by copolymerizing vinylidene chloride monomer and acrylic monomer (e.g., copolymerized polymer of vinylidene chloride monomer and acrylic monomer).

A density of the hollow particle CP may range from about 0.08 gram per cubic centimeters ($g/cm^3$) to about 0.40 $g/cm^3$ and in particular, may range from about 0.12 $g/cm^3$ to about 0.30 $g/cm^3$. In the case where the density of the hollow particle CP is less than 0.08 $g/cm^3$, the hollow particles CP may not be uniformly dispersed in the adhesive polymer resin RS. In the case where the density of the hollow particle CP is greater than 0.40 $g/cm^3$, a thickness of the shell SP of the hollow particle CP may be increased, and this may lead to deterioration in elastic force and shock absorption ratio of the hollow particle CP.

Referring to FIG. 5, the hollow particle CP may include the void portion HP and the shell SP. The shell SP may surround the void portion HP. The hollow particle CP may have a spherical shape. However, the invention is not limited to this example, and the hollow particle CP may have a quasispherical shape (e.g., an elliptical or spherical surface with at least one uneven portion).

A mean diameter of the hollow particle CP may range from about 10 micrometers (μm) to about 80 μm and in particular, may range from about 20 μm to about 70 μm. In the case where the hollow particle CP does not have a spherical shape, the mean diameter of the hollow particle CP may means a mean value of lengths of segments, each of which passes through a center of mass of the hollow particle CP and connects two opposite points on the outer surface of the hollow particle CP.

In the case where the mean diameter of the hollow particle CP is less than 10 μm, the elastic force and the shock absorption ratio of the hollow particle CP may be decreased. In this case, the shock absorbing module SAM may fail to effectively protect the display device DD from an external shock. In the case where the mean diameter of the hollow particle CP is greater than 80 μm, an interface roughness of the cushion layer CSL may be increased. In this case, an interface adhesion strength of the cushion layer CSL may be lowered and consequently, a failure rate may be increased.

According to an embodiment of the invention, since the shock absorbing module SAM includes the cushion layer CSL in which the hollow particle CP having a mean diameter of about 10 μm to about 80 μm is provided, the shock absorbing module SAM may have a sufficiently high interface adhesion strength and may reduce a force which is exerted to the display device DD by an external shock.

The hollow particle CP may include or define a first hollow particle CP whose mean diameter ranges from about 10 μm to about 40 μm, and a second hollow particle CP whose mean diameter ranges from about 40 μm to about 80 μm. The cushion layer CSL may include at least one of the first hollow particle CP and the second hollow particle CP. In other words, the cushion layer CSL may include the first hollow particle CP or the second hollow particle CP, or may include both of the first hollow particle CP and the second hollow particle CP. In the case where the cushion layer CSL includes both of the first hollow particle CP and the second hollow particle CP, the shock absorption ratio and the interface adhesion strength may be more suitably adjusted.

A weight percentage of the hollow particles CP to the total weight of the cushion layer CSL may range from about 0.5 wt % to about 20.0 wt %. A weight percentage of the adhesive polymer resin RS to the total weight of the cushion layer CSL may range from about 80.0 wt % to about 99.5 wt %.

In an embodiment, the weight percentage of the hollow particle CP to the total weight of the cushion layer CSL may range from about 5.0 wt % to about 10.0 wt %, and the weight percentage of the adhesive polymer resin RS to the total weight of the cushion layer CSL may range from about 90.0 wt % to about 95.0 wt %.

In the case where the weight percentage of the hollow particles CP is less than 0.5 wt %, the shock absorption ratio of the cushion layer CSL may be lowered, and thus, the display device DD may be easily broken by an external shock. In the case where the weight percentage of the hollow particles CP is greater than 20.0 wt %, the cushion layer CSL may not have a sufficiently high interface adhesion strength, and thus, a layer-separation or detachment issue may occur at the interface of the cushion layer CSL.

The embossed adhesive layer EM may be disposed on the cushion layer CSL. The invention is not limited to a specific material of the embossed adhesive layer EM, and various adhesive materials, which are well-known to a skilled person in this art, may be used for the embossed adhesive layer EM. In an embodiment, for example, at least one of various polymer resins may be used as the material of the embossed adhesive layer EM.

A pattern PT may be defined in or by portions of the embossed adhesive layer EM. The embossed adhesive layer EM may include a base portion BP, which includes or defines a first surface DS and a second surface US that are opposite to each other. The first surface DS may be adjacent to the cushion layer CSL and disposed in a plane which is parallel to a plane defined by the first direction DR1 and the second direction DR2. The pattern PT may be defined at the second surface US of the base portion BP of the embossed adhesive layer EM. The second surface US may define a reference surface or reference plane from which the pattern PT protrudes.

The pattern PT may be provided in plural as protrusions which each extend from the second surface US. The protrusions may be spaced apart from each other along the base portion BP (e.g., along the first direction DR1), and portions of the second surface US may be exposed between protrusions adjacent to each other. In an embodiment, the pattern PT and the embossed adhesive layer EM may constitute a single object. As a single object, extended portions of the base portion BP may define the pattern PT, or vice versa. In FIG. 4, the pattern PT is illustrated to have a protruding rectangular shape, however, the invention is not limited to a specific shape of the pattern PT. In an embodiment, for example, the pattern PT may have a semi-circular, semi-elliptical, or polygonal shape.

Since the embossed adhesive layer EM includes the pattern PT disposed protruding from the second surface US of the base portion BP, an adhesion area between the shock absorbing module SAM and the display panel DP in an adhesion process may be increased, and an increase in an adhesion strength between the shock absorbing module SAM and the display panel DP may be possible.

Figure 7:
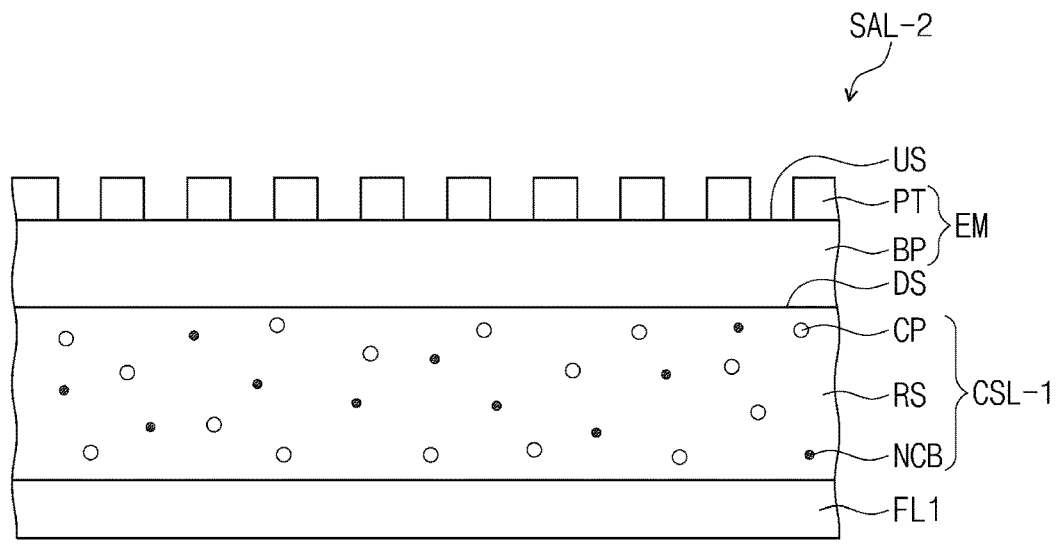
FIGS. 7 to 9 are enlarged cross-sectional views illustrating other embodiments of a shock absorbing layer.
Figure 8:
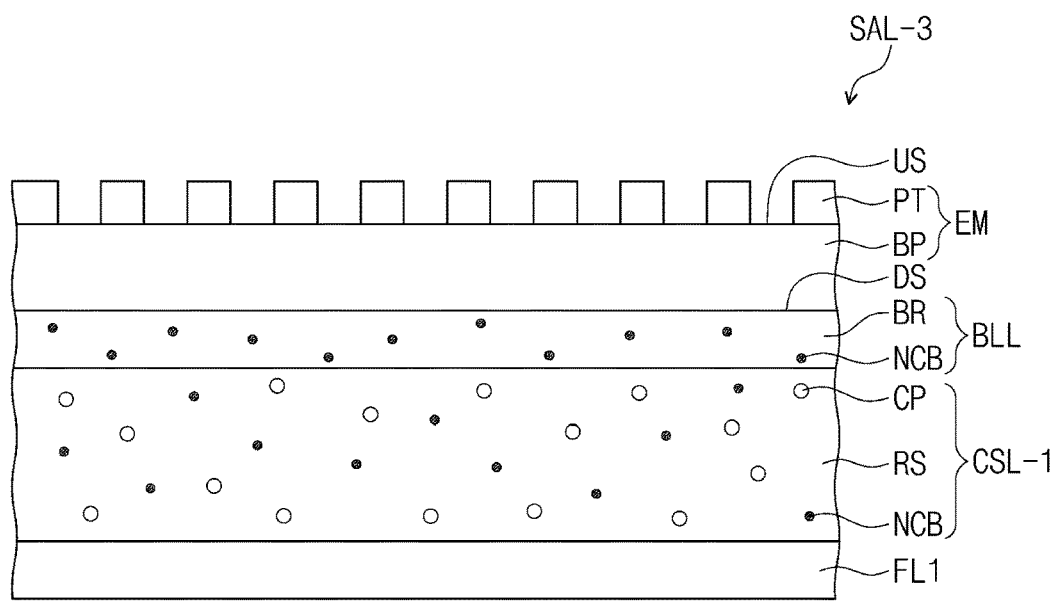
Figure 9:
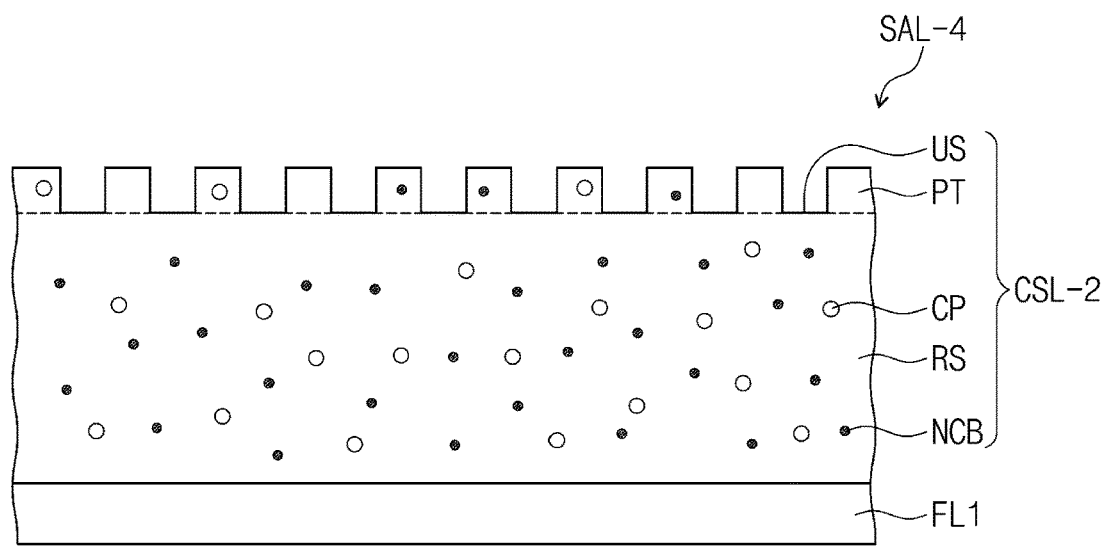

FIGS. 6A to 6F are enlarged cross-sectional views illustrating modified embodiments of the shock absorbing layer SAL including shock absorbing layers SAL-1a, SAL-1b, SAL-1c, SAL-1d, SAL-1e, and SAL-1f (hereinafter, SAL-1a to SAL-1f). FIGS. 7 to 9 are enlarged cross-sectional views illustrating other embodiments of the shock absorbing layer SAL including shock absorbing layers SAL-2, SAL-3, and SAL-4.

Each of the shock absorbing layers SAL-1a to SAL-1f shown in FIGS. 6A to 6F and each of the shock absorbing layers SAL-2, SAL-3, and SAL-4 of FIGS. 7 to 9 may correspond to the shock absorbing layer SAL shown in FIG. 4, and thus, the following description will be focused on the difference from the shock absorbing layer SAL described in FIG. 4.

Referring to FIGS. 6A to 6F, each of the shock absorbing layers SAL-1a to SAL-1f may further include a light-blocking layer BLL. The light-blocking layer BLL may include a base resin BR and a light blocking particle NCB (e.g., a carbon black nanoparticle NCB). The invention is not limited to a specific material of the base resin BR, and in an embodiment, a material known in this art (e.g., a polymer resin) may be used for the base resin BR. The carbon black nanoparticle NCB may have a size of nanometer order and may include a carbon-containing material, which is produced by the incomplete combustion of hydrocarbon and has a shape of colloid particle. The carbon black nanoparticle may have a mean diameter ranging from about 1 nanometer (nm) to about 1000 nm and may absorb light in a visible light wavelength range.

Since each of the shock absorbing layers SAL-1a to SAL-1f includes the light-blocking layer BLL, an external light, which is incident into the display device DD from outside thereof, may be absorbed by the light-blocking layer BLL. Thus, reducing reflection of the external light is possible. Accordingly, the visibility of the display device DD may be improved.

Referring to FIGS. 6A to 6F, stacking positions of the first film layer FL1 and the light-blocking layer BLL may be variously changed. In other words, the first film layer FL1 and the light-blocking layer BLL may be stacked between the base layer BSL (e.g., see FIG. 3) and the embossed adhesive layer EM. Here, the invention is not limited to a specific stacking order of the first film layer FL1 and the light-blocking layer BLL.

The cushion layer CSL may be directly attached to an element, which is disposed on or under the same, without any intervening additional adhesive layer. In other words, an element on the cushion layer CSL may be directly disposed on a top portion of the cushion layer CSL, and an element under the cushion layer CSL may be directly disposed on a bottom portion of the cushion layer CSL. In an embodiment, for example, referring to FIG. 6A, the light-blocking layer BLL may be directly disposed on the cushion layer CSL, and the first film layer FL1 may be directly disposed under the cushion layer CSL. As two elements being "directly disposed" or "directly attached" to each other, an interface may be formed between the elements.

FIGS. 6A to 6F illustrate the shock absorbing layers SAL-1a to SAL-1f, which are different from each other in terms of the stacking order of the first film layer FL1, the cushion layer CSL, and the light-blocking layer BLL.

Figure 6A:
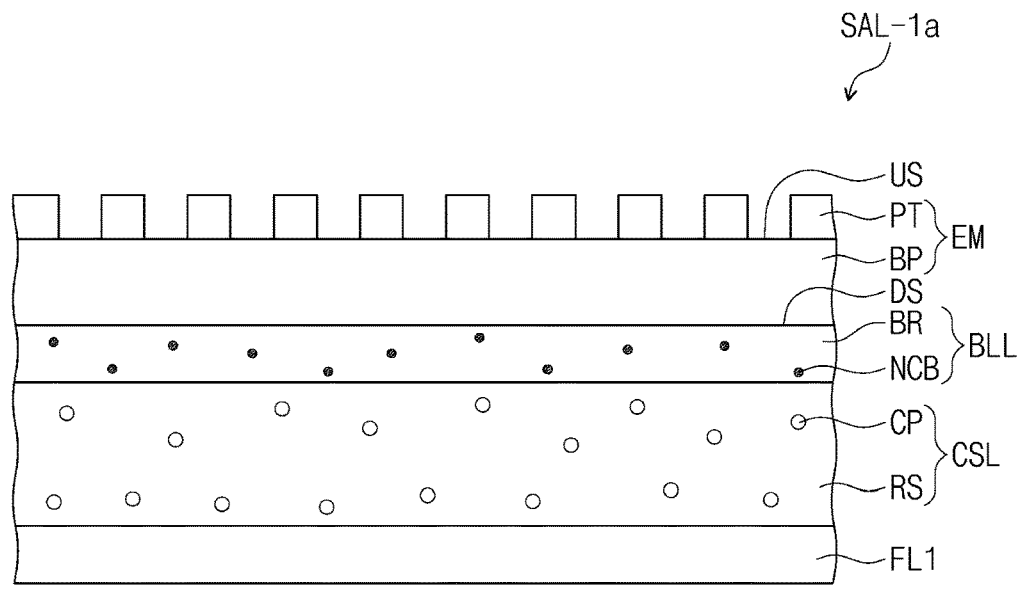
FIGS. 6A to 6F are enlarged cross-sectional views illustrating modified embodiments of a shock absorbing layer.

In the shock absorbing layer SAL-1a shown in FIG. 6A, the cushion layer CSL may be directly disposed on the first film layer FL1, and the light-blocking layer BLL may be directly disposed on the cushion layer CSL.

Figure 6B:
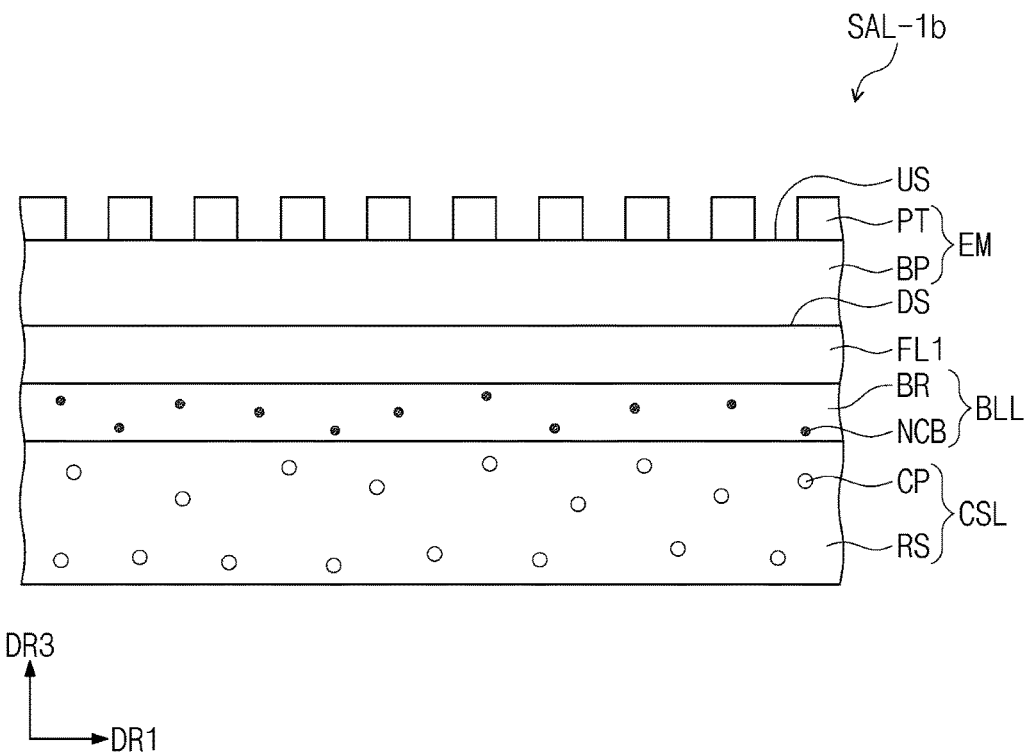

In the shock absorbing layer SAL-1b shown in FIG. 6B, the light-blocking layer BLL may be directly disposed on the cushion layer CSL, and the first film layer FL1 may be disposed on the light-blocking layer BLL.

Figure 6C:
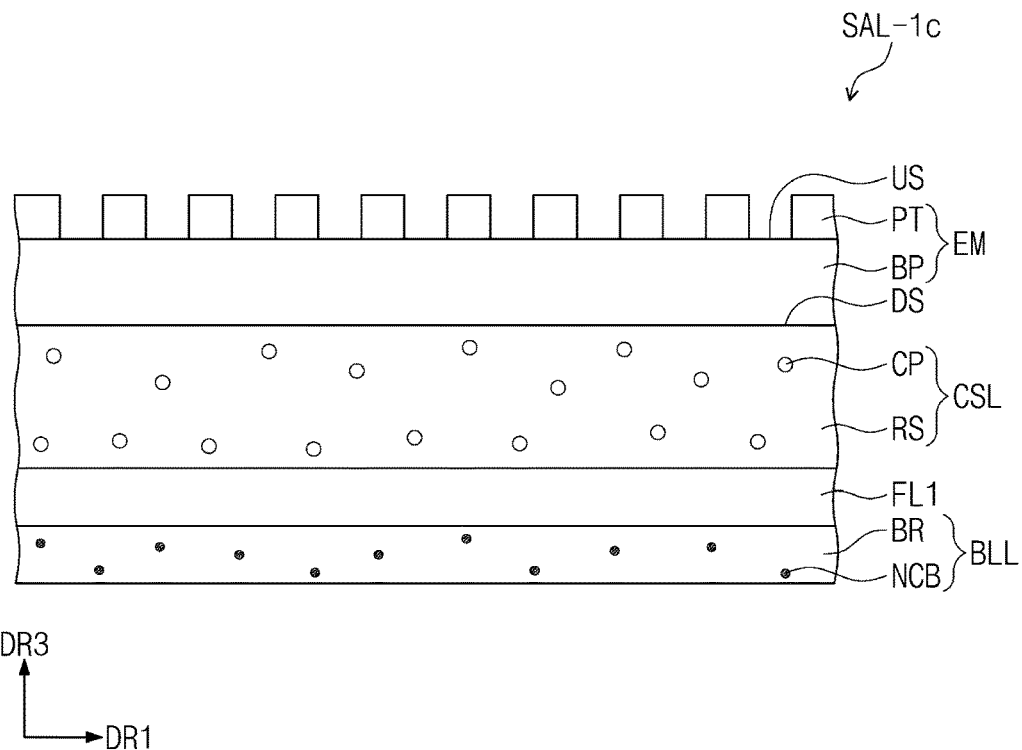

In the shock absorbing layer SAL-1c shown in FIG. 6C, the first film layer FL1 may be disposed on the light-blocking layer BLL, and the cushion layer CSL may be directly disposed on the first film layer FL1.

Figure 6D:
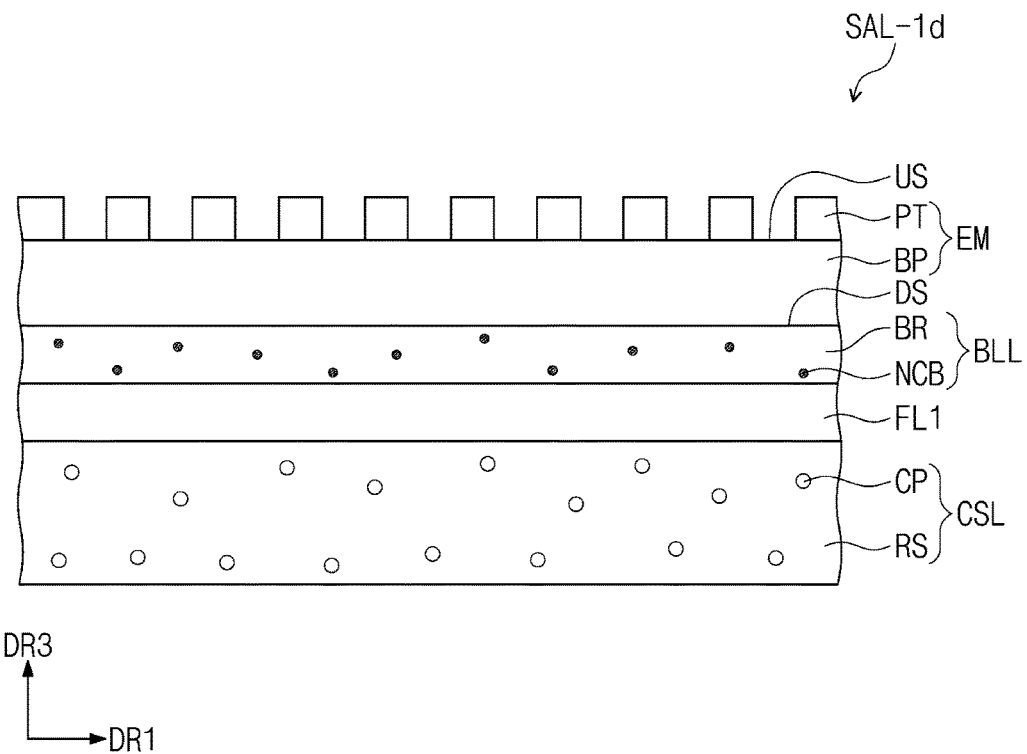

In the shock absorbing layer SAL-1d shown in FIG. 6D, the first film layer FL1 may be directly disposed on the cushion layer CSL, and the light-blocking layer BLL may be disposed on the first film layer FL1.

Figure 6E:
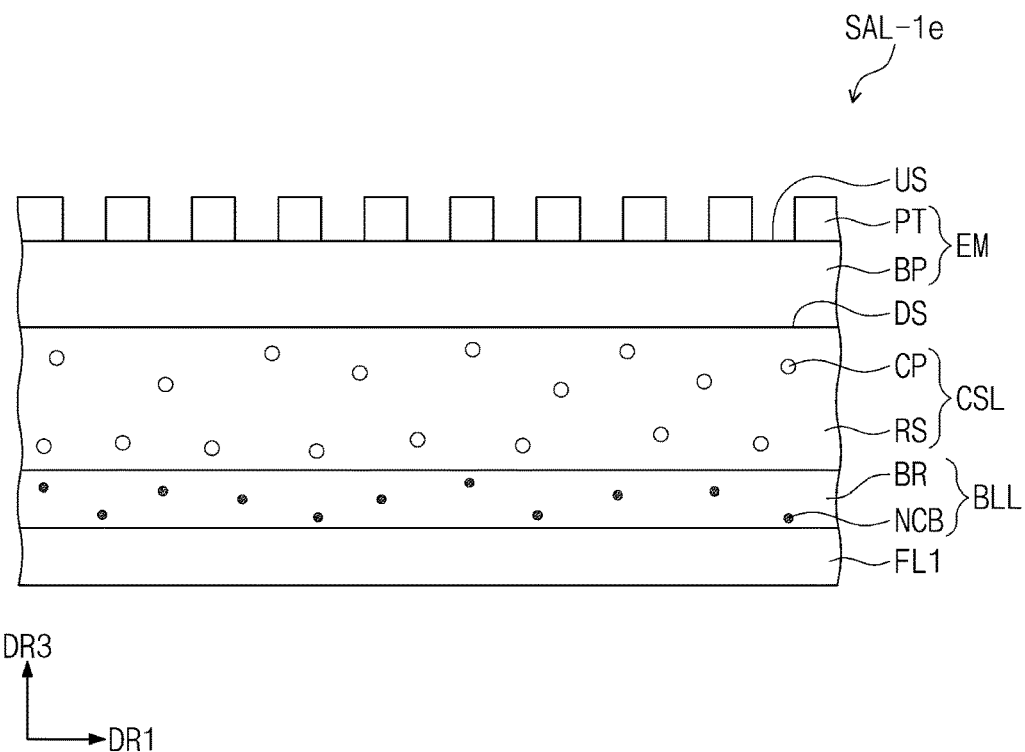

In the shock absorbing layer SAL-1e shown in FIG. 6E, the light-blocking layer BLL may be disposed on the first film layer FL1, and the cushion layer CSL may be directly disposed on the light-blocking layer BLL.

Figure 6F:
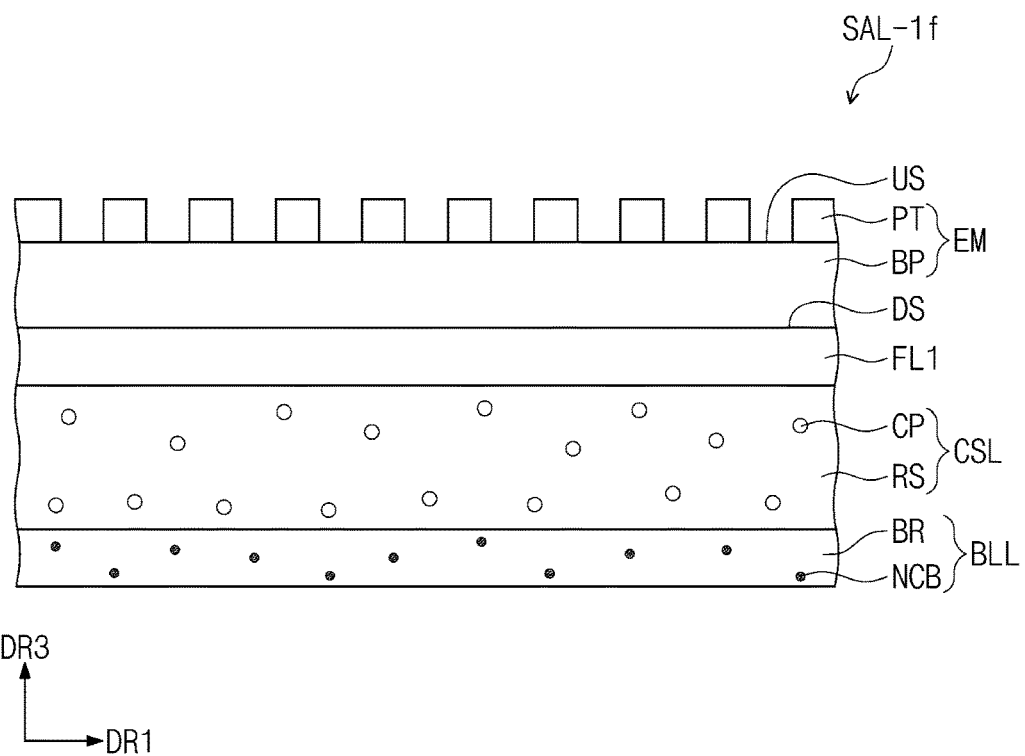

In the shock absorbing layer SAL-1f shown in FIG. 6F, the first film layer FL1 may be directly disposed on the cushion layer CSL, and the cushion layer CSL may be directly disposed on the light-blocking layer BLL.

Although FIGS. 7 to 9 illustrate examples, in which the shock absorbing layers SAL-2, SAL-3, and SAL-4 have specific stacking structures, the stacking structures of layers within the shock absorbing layers SAL-2, SAL-3, and SAL-4 may be various changed, as shown in FIGS. 6A to 6F.

Referring to FIG. 7, the shock absorbing layer SAL-2 may include the first film layer FL1, a cushion layer CSL-1, and the embossed adhesive layer EM, which are sequentially stacked.

Referring to FIG. 7, the cushion layer CSL-1 may further include the carbon black nanoparticle NCB. Since the cushion layer CSL-1 includes the carbon black nanoparticle NCB, the cushion layer CSL-1 may have a light-blocking function.

A weight percentage of the carbon black nanoparticle NCB to the total weight of the cushion layer CSL-1 may range from about 0.5 wt % to about 5.0 wt %. In the cushion layer CSL-1, a weight percentage of the hollow particle to the total weight of the adhesive polymer resin RS and the hollow particle CP may range from about 0.5 wt % to about 20.0 wt % and in particular, may range from about 5.0 wt % to about 10.0 wt %.

In the case where the cushion layer CSL-1 meets the afore-described ratio condition, the cushion layer CSL-1 may have desired characteristics in light-blocking function, shock absorption ratio, and interface adhesion strength.

Since the cushion layer CSL-1 has a light-blocking function, the light-blocking layer BLL may be omitted from the shock absorbing layer SAL-2. Thus, the shock absorbing layer SAL-2 may be fabricated to have a relatively slim structure. In addition, since the number of layers constituting the shock absorbing layer SAL-2 is reduced, reduction of a stress exerted on edge portion of each of the layers constituting the shock absorbing layer SAL-2 is possible. Accordingly, layer-separation or detachment issue at an interface of the edge portion of each layer may be reduced or effectively prevented.

The shock absorbing layer SAL-3 of FIG. 8 may further include the light-blocking layer BLL, which is directly disposed between the cushion layer CSL-1 and the embossed adhesive layer EM. Since the shock absorbing layer SAL-3 further includes the light-blocking layer BLL disposed on the cushion layer CSL-1 including the carbon black nanoparticle NCB, the reflection of the external light may be reduced and the visibility of the display device DD may be further improved.

Referring to FIG. 9, in the shock absorbing layer SAL-4, a cushion layer CSL-2 and the embossed adhesive layer EM may be provided to form a single object. That is, the embossed adhesive layer EM is defined by a plurality of protrusions spaced apart from each other (e.g., pattern PT), and extended portions of the cushion layer CSL-2 define the plurality of protrusions. In this case, the pattern PT may be defined in or at a second surface US of the cushion layer CSL-2. The second surface US of the cushion layer CSL-2 of FIG. 9 may be a surface corresponding to the second surface US of the embossed adhesive layer EM of FIG. 4. Since the cushion layer CSL-2 and the embossed adhesive layer EM are provided as a single object, the number of layers constituting the shock absorbing layer SAL-4 may be further reduced. Accordingly, layer-separation or detachment issue at the edge portion of each layer may be further reduced or effectively prevented.

Figure 10:
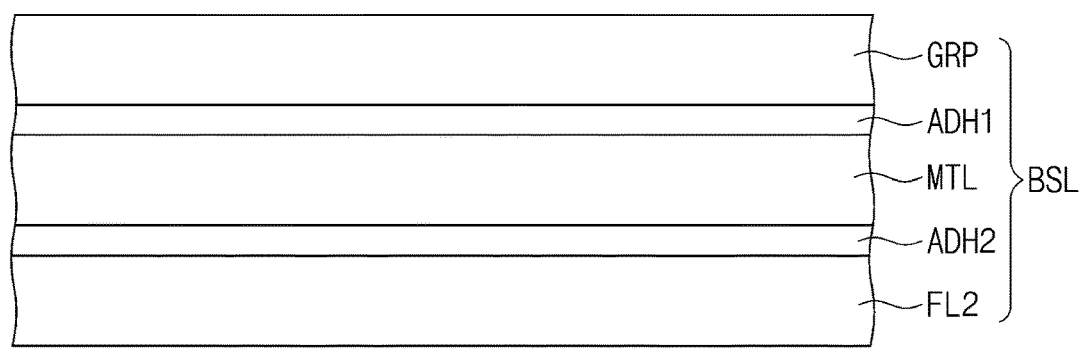
FIG. 10 is an enlarged cross-sectional view of an embodiment of a base layer of FIG. 3.

FIG. 10 is an enlarged cross-sectional view of an embodiment of the base layer BSL of FIG. 3. The base layer BSL may include a second film layer FL2, a metal layer MTL, a graphite layer GRP, which are sequentially stacked in a direction toward the shock absorbing layer SAL. A first adhesive layer ADH1 may be disposed between the graphite layer GRP and the metal layer MTL, and a second adhesive layer ADH2 may be disposed between the metal layer MTL and the second film layer FL2. The base layer BSL may be disposed below the shock absorbing layer SAL to protect the shock absorbing module SAM from a change in external temperature or from an external shock. The graphite layer GRP may be disposed closest to the shock absorbing layer SAL.

The second film layer FL2 may have substantially the same features as those of the first film layer FL1 described above. The second film layer FL2 may be formed of or include, for example, a polyethyleneterephthalate resin. The metal layer MTL may be formed of or include at least one of various metallic materials (e.g., copper or the like).

Figure 11:
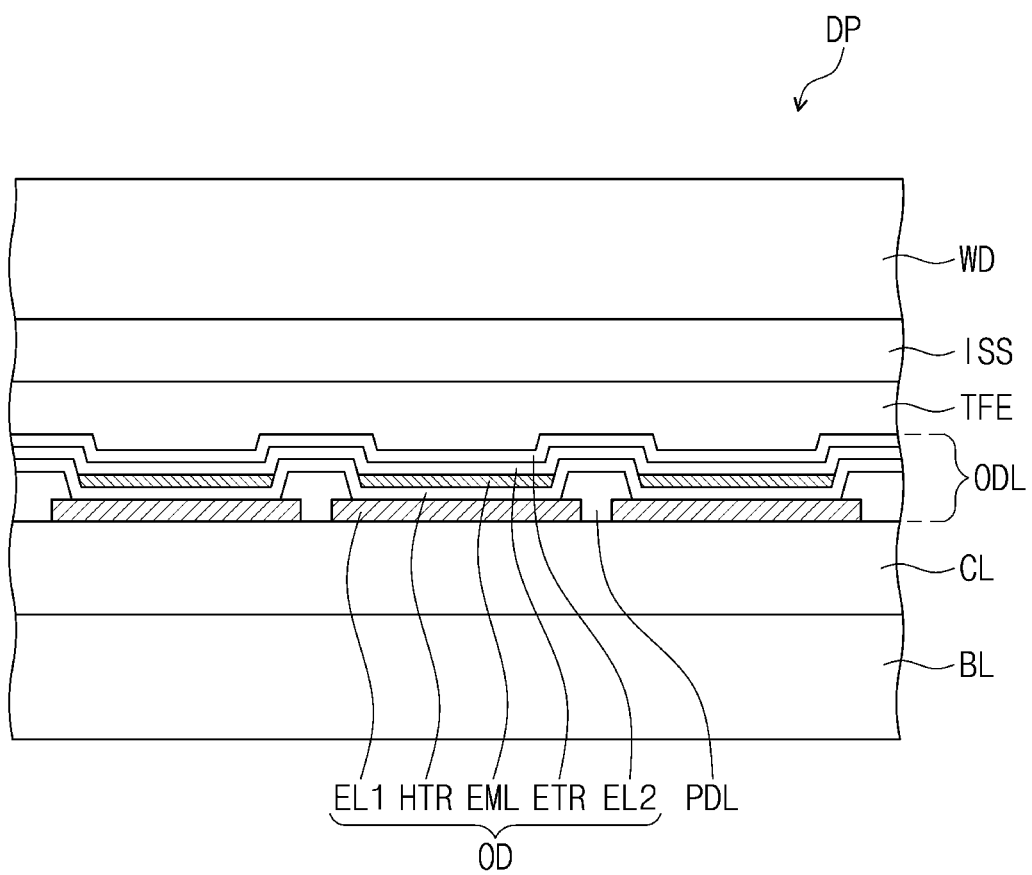
FIG. 11 is an enlarged cross-sectional view of an embodiment of a display panel of FIG. 2.

FIG. 11 is an enlarged cross-sectional view illustrating the display panel DP shown in FIG. 2. Referring to FIG. 11, the display panel DP may include a substrate BL, a circuit layer CL, a light-emitting device layer ODL, a thin encapsulation layer TFE, an input sensing sensor ISS (e.g., input sensing layer ISS), and a window WD.

The substrate BL may include a synthetic resin film. The substrate BL may include a thermo-setting resin. The substrate BL may be a polyimide resin layer, but the invention is not limited to a specific material of the substrate BL. The substrate BL may include at least one of acrylic resin, methacrylic resin, polyisoprene resin, vinyl resin, epoxy resin, urethane resin, cellulose resin, siloxane resin, polyamide resin, and perylene resin.

The circuit layer CL may be disposed on the substrate BL. The circuit layer CL may include a plurality of insulating layers and a plurality of circuit devices (not shown). The insulating layers may include an organic layer and/or an inorganic layer. The circuit device (not shown) may include signal lines, a pixel driving circuit, and so forth. The circuit layer CL may include or be formed by providing an insulating layer, a semiconductor layer, and a conductive layer using a coating or depositing process and then patterning the insulating layer, the semiconductor layer, and the conductive layer using a photolithography process.

The light-emitting device layer ODL may include a light-emitting device OD provided in plural (e.g., a plurality of light-emitting devices OD) and a pixel-defining layer PDL. The light-emitting devices OD may each include a first electrode EL1 a hole transport region HTR, a light emitting layer EML, an electron transport region ETR, and a second electrode EL2. The light-emitting device OD may be connected to the circuit layer CL to be controlled and/or driven thereby to generate light, display an image IM, etc.

The first electrode EL1 may have a conductive property. The first electrode EL1 may include or be formed of a metal alloy or a conductive compound. The first electrode EL1 may be an anode. In an embodiment, the first electrode EL1 may be a pixel electrode. The invention is not limited to a specific material of the first electrode EL1 and at least one of materials known in this art may be included in the first electrode EL1.

The hole transport region HTR may be disposed on the first electrode EL1. The hole transport region HTR may include at least one of a hole injection layer, a hole transport layer, a hole buffer layer, and an electron blocking layer. The hole transport region HTR may have a single-layered structure, which is formed of a single material or of a plurality of different materials, or a multi-layered structure including a plurality of layers, which are formed of a plurality of different materials. The invention is not limited to a specific material of the hole transport region HTR, and in an embodiment, at least one of materials known in this art may be included in the hole transport region HTR.

The light emitting layer EML may be disposed on the hole transport region HTR. The light emitting layer EML may include an organic compound as its light-emitting material. However, the invention is not limited to this example, and in an embodiment, the light emitting layer EML may include a quantum dot material as its light-emitting material. In an embodiment, a core of the quantum dot may be selected from II-VI compounds, III-V compounds, IV-VI compounds, IV elements, IV compounds, and combination thereof, but the invention is not limited to this example.

The electron transport region ETR may be disposed on the light emitting layer EML. The electron transport region ETR may include at least one of a hole blocking layer, an electron transport layer, and an electron injection layer, but the invention is not limited to this example. The electron transport region ETR may have a single-layered structure, which is provided or formed of a single material or of a plurality of different materials, or a multi-layered structure including a plurality of layers, which include or are formed of a plurality of different materials. The invention is not limited to a specific material of the electron transport region ETR, and in an embodiment, at least one of materials known in this art may be included in the electron transport region ETR.

The second electrode EL2 may be provided on the electron transport region ETR. The second electrode EL2 may be a common electrode or a cathode. The invention is not limited to a specific material of the second electrode EL2, and in an embodiment, at least one of materials known in this art may be included in the second electrode EL2.

The pixel-defining layer PDL may define an opening in which portions of the light-emitting device OD are disposed. The opening of the pixel-defining layer PDL may define a light-emitting area of a pixel of the display panel DP, without being limited thereto.

In an embodiment, the thin encapsulation layer TFE may directly cover the second electrode EL2. In an embodiment, a capping layer (not shown) may be further disposed to cover the second electrode EL2. Here, the thin encapsulation layer TFE may directly cover the capping layer. The thin encapsulation layer TFE may include at least one of organic and inorganic layers.

The input sensing sensor ISS may be disposed on the thin encapsulation layer TFE. The input sensing sensor ISS may be directly disposed on the thin encapsulation layer TFE. The input sensing sensor ISS may sense a change in electrostatic capacitance or a change in pressure caused by an external object incident to the display panel DP, and information obtained by this sensing may be used to determine whether there is an external input to the display panel DP or the display device DD.

The window WD may be disposed on the input sensing sensor ISS. The window WD may be a plastic substrate, a glass substrate, or a substrate including an organic/inorganic combination material. The window WD may include a synthetic resin film. The window WD may be a synthetic resin film, which includes at least one of acrylic resin, methacrylic resin, polyisoprene, vinyl resin, epoxy resin, urethane resin, cellulose resin, siloxane resin, polyamide resin, and perylene resin.

In the description of FIG. 11, the light-emitting devices OD of the display panel DP was described to be a self-luminous device, but the invention is not limited to this example. In an embodiment, for example, the display panel DP may be one of a liquid crystal display panel, a plasma display panel, an electrophoretic display panel, a microelectromechanical system ("MEMS") display panel, and an electrowetting display panel.

Figure 12A:
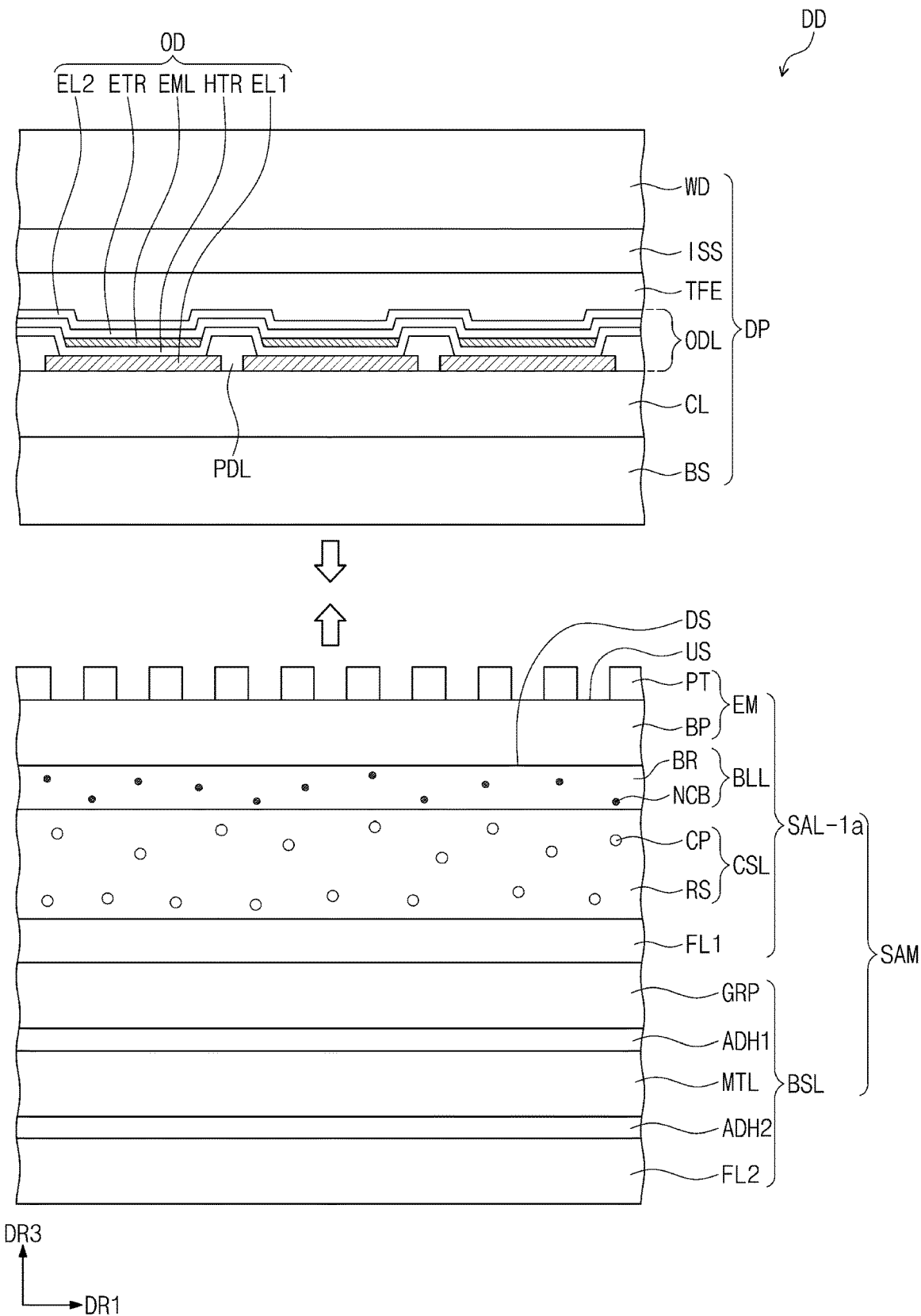
FIGS. 12A and 12B are sectional views illustrating structures of a display device in an embodiment of a method of manufacturing a display device.
Figure 12B:
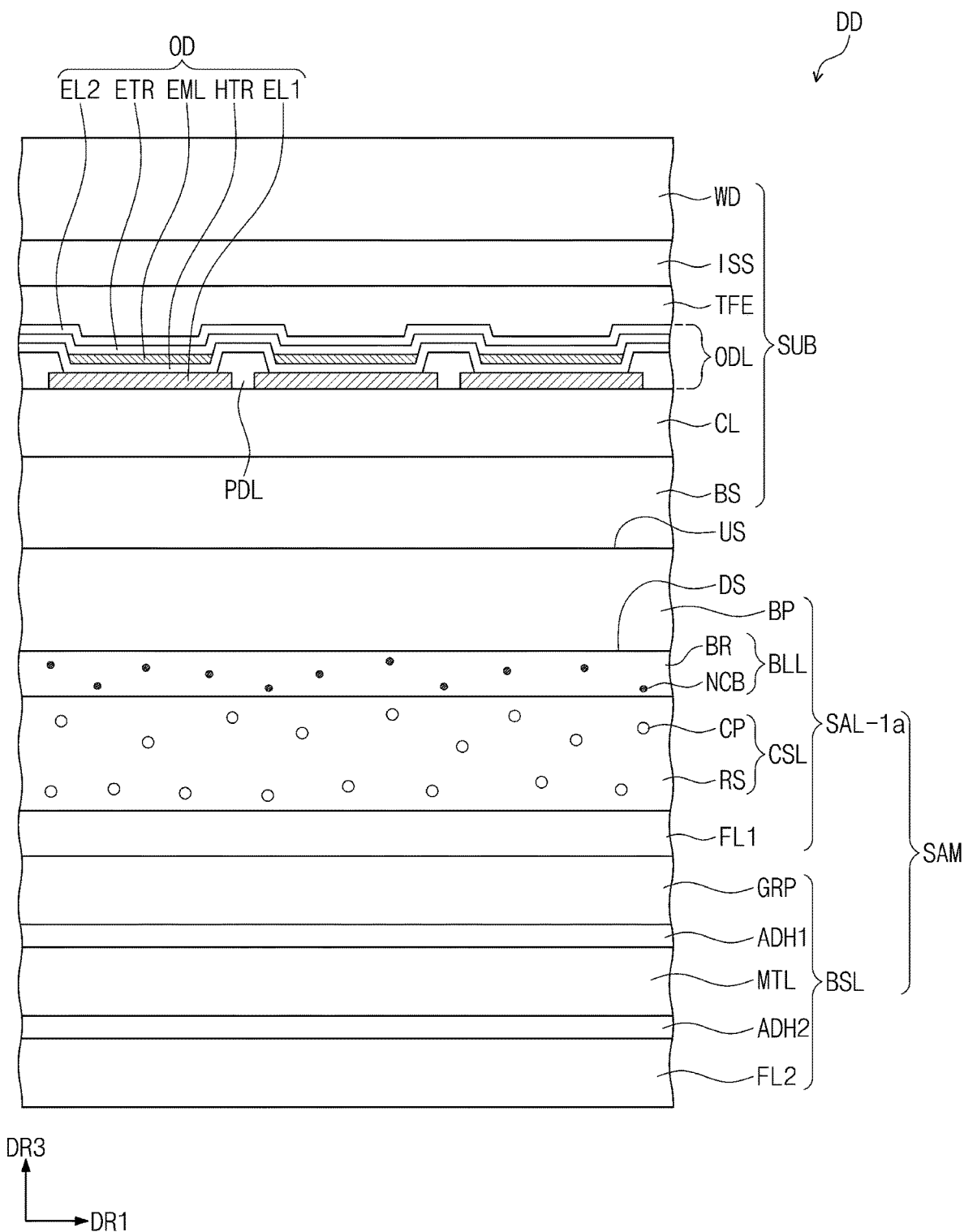

FIGS. 12A and 12B are enlarged cross-sectional views illustrating layer structures of the display device DD, in an embodiment of a method of adhering the display panel DP to the shock absorbing module SAM. Particularly, FIGS. 12A and 12B respectively showing structures of the display device DD before and after an embodiment of a process of adhering the display panel DP and the shock absorbing module SAM to each other. The display panel DP and the shock absorbing module SAM of FIGS. 12A and 12B may have substantially the same features as those in the previously-described embodiments.

Referring to FIGS. 12A and 12B, the display panel DP and the shock absorbing module SAM may be adhered to each other by the embossed adhesive layer EM in the shock absorbing module SAM. In the process of adhering the display panel DP to the shock absorbing module SAM, the pattern PT defined in the embossed adhesive layer EM may be planarized by pressure. That is, the protrusions of the pattern PT are compressed to coincide with the second surface US within the shock absorbing module SAM and define the second surface US which is planarized as shown in FIG. 12B. Thus, the embossed adhesive layer EM included in the display device DD which is coupled to the display panel DP may not include the pattern PT.

Hereinafter, embodiments and comparative embodiments may be referred to describe technical effects of the shock absorbing module SAM and the display device DD including the same, according to an embodiment of the invention.

1. Measurement of Shock Absorption Ratio (1) Fabrication of Shock Absorbing Layer SAL A first film layer FL1 including polyimide was disposed on a metal support layer made of copper using an adhesive layer. Thereafter, a shock absorbing layer SAL according to an example embodiment 1 was provided by directly disposing a cushion layer CSL on the first film layer FL1, without any intervening adhesive layer. In the shock absorbing layer SAL of the example embodiment 1, the cushion layer CSL was provided by combining an adhesive acrylic polymer resin and hollow particles.

The comparative shock absorbing layer of a comparative embodiment 1 was provided formed by the same method as that for the shock absorbing layer SAL of the example embodiment 1, except that the comparative cushion layer was provided of only a non-adhesive acrylic polymer resin and an adhesive member was additionally disposed between the comparative cushion layer and the comparative first film layer.

(2) Measurement of Shock Absorption Ratio

The shock absorbing layer SAL of the example embodiment 1 was fixedly disposed on a testing substrate, and then, a stainless steel ("SUS") ball of 13.8 grams (g) was dropped from a height of 10 centimeters (cm) to measure an impulse (S1) exerted on the cushion layer CSL. Thereafter, the shock absorbing layer SAL was removed, and the SUS ball of 13.8 g was dropped onto the empty testing substrate from the same height of 10 cm to measure an impulse (S0) exerted on the test substrate. The process was repeated three times. Thereafter, the shock absorption ratio of the cushion layer CSL was calculated using the following formula.

Shock absorption ratio (%)=$(S0-S1)/(S0\times100)$, where $S0$ is the impulse exerted on the test substrate and $S1$ is the impulse exerted on the cushion layer CSL.

The shock absorption ratio in the comparative embodiment 1 was measured by the same method as that in the example embodiment 1, except that the comparative shock absorbing layer according to the comparative embodiment 1 was used.

The following Table 1 summarizes the shock absorbing abilities of the shock absorbing layers according to the example embodiment 1 and the comparative embodiment 1.

TABLE 1

|  | Shock absorption ratio at first impact (%) | Shock absorption ratio at second impact (%) | Shock absorption ratio at third impact (%) | Mean shock absorption ratio (%) |
|---|---|---|---|---|
| Example embodiment 1 | 30.89 | 26 | 22.22 | 26.4 |
| Comparative embodiment 1 | 25.44 | 22.37 | 21.22 | 23 |

Referring to Table 1, the shock absorption ratio at each impact and the mean shock absorption ratio of the shock absorbing layer SAL according to the example embodiment 1 were higher than the shock absorption ratio of the comparative shock absorbing layer according to the comparative embodiment 1. This result shows that the shock absorbing layer SAL according to the example embodiment 1 has an improved shock absorption effect.

In the shock absorbing layer SAL according to an embodiment of the invention, the cushion layer CSL may include the adhesive polymer resin RS and the hollow particle CP and an additional adhesive layer may be omitted, which leads to this improved shock absorption effect.

The shock absorbing layer in the example embodiment 1 was composed of a metal support layer made of copper, the first film layer FL1 made of polyimide, and a cushion layer CSL but did not include a light-blocking layer BLL and an embossed adhesive layer EM. However, since the light-blocking layer BLL and the embossed adhesive layer EM are used as a light-blocking element and an adhesion element, respectively, they have a small contribution to the shock absorption. Thus, if the light-blocking layer BLL and the embossed adhesive layer disposed on the shock absorbing layer SAL have the same structure in the example embodiment 1 and the comparative embodiment 1, it is expected that the result, in which a difference in shock absorption ratio is similar to that in Table 1, will be obtained According to one or more embodiment of the invention, the shock absorbing module SAM may include the cushion layer CSL including the adhesive polymer resin RS, and the hollow particle CP which is dispersed in the adhesive polymer resin RS and includes the void portion HP and the shell SP which surrounds the void portion HP. Thus, separation or detachment of layers constituting the shock absorbing module SAM by stress may be reduced or effectively prevented.

The display device DD according to one or more embodiment of the invention may include the shock absorbing module SAM described above. Thus, the display device DD may have relatively high durability against a force from an external shock thereto and a relatively slim overall thickness.

According to one or more embodiment of the invention, a shock absorbing module SAM may have relatively high durability and reduced overall thickness which provides a relatively slim structure.

According to one or more embodiment of the invention, a display device DD including a shock absorbing module SAM may have relatively high durability and a slim structure.

While embodiments of the invention have been particularly shown and described, it will be understood by one of ordinary skill in the art that variations in form and detail may be made therein without departing from the spirit and scope of the invention.

What is claimed is:

1. A shock absorbing module, comprising:
    a shock absorbing layer at which the shock absorbing module is attached to a surface of a display panel which is opposite to a display surface of the display panel, the shock absorbing layer comprising:
        a self-adhesive cushion layer comprising an adhesive polymer resin, and a hollow particle which is in the adhesive polymer resin,
        the self-adhesive cushion layer comprising the hollow particle which is in the adhesive polymer resin defining extended portions thereof spaced apart from each other, and
        the extended portions which are defined by the self-adhesive cushion layer defining an embossed adhesive layer of the shock absorbing layer which is attached to the surface of the display panel, and
    a base layer facing the shock absorbing layer.

2. The shock absorbing module of claim 1, further comprising a light-blocking layer,
    the shock absorbing module attached to the display panel disposes the self-adhesive cushion layer and the embossed adhesive layer between the display panel and the light-blocking layer.

3. The shock absorbing module of claim 1, wherein the adhesive polymer resin within the self-adhesive cushion layer comprises at least one of acrylic polymer, urethane polymer, olefin polymer, imide polymer, amide polymer, ester polymer, isocyanate polymer, epoxy polymer, and silicone polymer.

4. The shock absorbing module of claim 1, wherein the hollow particle within the self-adhesive cushion layer comprises a void portion and a shell which surrounds the void portion, the shell of the hollow particle comprising polymerized acrylic monomer or polymerized vinyl chloride monomer.

5. The shock absorbing module of claim 1, wherein a density of the hollow particle ranges from about 0.08 g/cm$^3$ to about 0.40 g/cm$^3$.

6. The shock absorbing module of claim 1, wherein a weight percentage of the hollow particle to a total weight of the self-adhesive cushion layer ranges from about 0.5 wt % to about 20.0 wt %.

7. The shock absorbing module of claim 1, wherein the hollow particle within the self-adhesive cushion layer has a mean diameter from about 10 μm to about 40 μm or a mean diameter from about 40 μm to about 80 μm.

8. The shock absorbing module of claim 1, wherein
    the hollow particle is provided in plural within the shock absorbing layer to define a plurality of hollow particles, and
    the extended portions which define the embossed adhesive layer within the shock absorbing layer comprise a hollow particle among the plurality of hollow particles.

9. The shock absorbing module of claim 1, wherein the self-adhesive cushion layer further comprises a light blocking material in the adhesive polymer resin.

10. The shock absorbing module of claim 9, wherein
    the light blocking material is a carbon black nanoparticle, and a weight percentage of the carbon black nanoparticle to a total weight of the self-adhesive cushion layer ranges from about 0.5 wt % to about 5.0 wt %.

11. The shock absorbing module of claim 1, wherein
the shock absorbing layer further comprises a film layer comprising polyimide, and
the shock absorbing module attached to the display panel disposes the embossed adhesive layer between the display panel and the film layer.

12. The shock absorbing module of claim 1, wherein the base layer comprises a film layer, a metal layer and a graphite layer, which are sequentially stacked in a direction toward the shock absorbing layer.

13. The shock absorbing module of claim 12, wherein within the base layer:
the film layer comprises polyethyleneterephthalate, and
the metal layer comprises copper.

14. A shock absorbing layer, comprising:
a self-adhesive cushion layer which is attached to a surface of a display panel which is opposite to a display surface of the display panel, the self-adhesive cushion layer comprising:
an adhesive polymer resin;
a hollow particle in the adhesive polymer resin, the hollow particle comprising a polymerized acrylic monomer or a polymerized vinyl chloride monomer; and
a carbon black nanoparticle in the adhesive polymer resin;
the self-adhesive cushion layer comprising the hollow particle and the carbon black nanoparticle which are in the adhesive polymer resin defining extended portions thereof spaced apart from each other, and
the extended portions which are defined by the self-adhesive cushion layer defining an embossed adhesive layer attached to the surface of the display panel.

15. The shock absorbing layer of claim 14, wherein the adhesive polymer resin within the self-adhesive cushion layer comprises an acrylic resin.

16. The shock absorbing layer of claim 14, wherein
a weight percentage of the carbon black nanoparticle to a total weight of the self-adhesive cushion layer ranges from about 0.5 wt % to about 5.0 wt %, and
a weight percentage of the hollow particle to a total weight of the adhesive polymer resin and the hollow particle ranges from about 0.5 wt % to about 20 wt %.

17. The shock absorbing layer of claim 14, wherein
the hollow particle and the carbon black nanoparticle are each provided in plural within the shock absorbing layer to define a plurality of hollow particles and a plurality of carbon black nanoparticles, and
the extended portions which define the embossed adhesive layer comprise a hollow particle among the plurality of hollow particles and a carbon black nanoparticle among the plurality of carbon black nanoparticles.

18. The shock absorbing layer of claim 14, wherein the hollow particle has a mean diameter from about 10 μm to about 80 μm.

19. A display device, comprising:
a display panel; and
a shock absorbing layer which is attached to a surface of the display panel which is opposite to a display surface of the display panel,
wherein
the shock absorbing layer comprises:
a self-adhesive cushion layer comprising:
an acrylic resin, and
a hollow particle which is in the acrylic resin, has a mean diameter from about 10 μm to about 80 μm, and comprises a polymerized acrylic monomer or a polymerized vinyl chloride monomer;
the self-adhesive cushion layer comprising the hollow particle defining extended portions spaced apart from each other, and
the extended portions which are defined by the self-adhesive cushion layer defining an embossed adhesive layer of the shock absorbing layer,
the embossed adhesive layer being attached to the surface of the display panel.

20. The display device of claim 19, wherein the display panel comprises:
a light-emitting device;
a thin encapsulation layer on the light-emitting device; and
an input sensing sensor on the thin encapsulation layer.

* * * * *